(12) United States Patent
Chi

(10) Patent No.: US 11,670,606 B2
(45) Date of Patent: Jun. 6, 2023

(54) HIGH-FREQUENCY DEVICE

(71) Applicant: InnoLux Corporation, Miao-Li County (TW)

(72) Inventor: Jen-Hai Chi, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 239 days.

(21) Appl. No.: 17/115,755

(22) Filed: Dec. 8, 2020

(65) Prior Publication Data

US 2022/0130777 A1 Apr. 28, 2022

(30) Foreign Application Priority Data

Oct. 28, 2020 (CN) .......................... 202011173183.9

(51) Int. Cl.
| | | |
|---|---|---|
| *H01L 23/66* | (2006.01) | |
| *H01L 23/485* | (2006.01) | |
| *H01L 23/31* | (2006.01) | |
| *H01Q 1/38* | (2006.01) | |
| *H01L 23/00* | (2006.01) | |

(52) U.S. Cl.
CPC .......... *H01L 23/66* (2013.01); *H01L 23/3121* (2013.01); *H01L 23/3142* (2013.01); *H01L 23/485* (2013.01); *H01L 24/05* (2013.01); *H01Q 1/38* (2013.01); *H01L 2223/6677* (2013.01); *H01L 2224/023* (2013.01)

(58) Field of Classification Search
CPC .... H01L 23/3142; H01L 23/315; H01L 23/66
See application file for complete search history.

(56) References Cited

U.S. PATENT DOCUMENTS 10,153,550 B2    12/2018    Orui

FOREIGN PATENT DOCUMENTS

CN           107431275 A        12/2017

*Primary Examiner* — Amar Movva
(74) *Attorney, Agent, or Firm* — Winston Hsu

(57) ABSTRACT

A high-frequency device includes a second substrate disposed opposite to a first substrate, a first electrode disposed on a side surface of the first substrate adjacent to the second substrate, a second electrode disposed on a side surface of the second substrate adjacent to the first substrate, a sealant disposed between the first substrate and the second substrate, and a dielectric layer sandwiched between the first substrate and the second substrate by the sealant. The dielectric layer includes a gas or vacuum.

19 Claims, 8 Drawing Sheets

HIGH-FREQUENCY DEVICE

BACKGROUND OF THE DISCLOSURE

1. Field of the Disclosure

The present disclosure relates to a high-frequency device, in particular to a high-frequency device using a gas or vacuum as a dielectric layer.

2. Description of the Prior Art

With the evolution of high-frequency devices, the $5^{th}$ generation wireless system (5G) is a communication technology of a new generation. When a high-frequency device is placed indoors, signal transmission may be severely blocked. Therefore, the design of high-frequency devices as signal boosters has become one of the current research topics, for example, the application of windows equipped with a (transparent) antenna function to serve as a signal booster.

SUMMARY OF THE DISCLOSURE

A high-frequency device of the present disclosure includes a first substrate, a second substrate, a first electrode, a second electrode, a sealant and a dielectric layer. The second substrate is disposed opposite to the first substrate. The first electrode is disposed on a side surface of the first substrate adjacent to the second substrate. The second electrode is disposed on a side surface of the second substrate adjacent to the first substrate. The sealant is disposed between the first substrate and the second substrate. The dielectric layer is sandwiched between the first substrate and the second substrate by the sealant. The dielectric layer includes a gas or vacuum.

These and other objectives of the present disclosure will no doubt become obvious to those of ordinary skill in the art after reading the following detailed description of the embodiment that is illustrated in the various figures and drawings.

DETAILED DESCRIPTION

Figure 1:
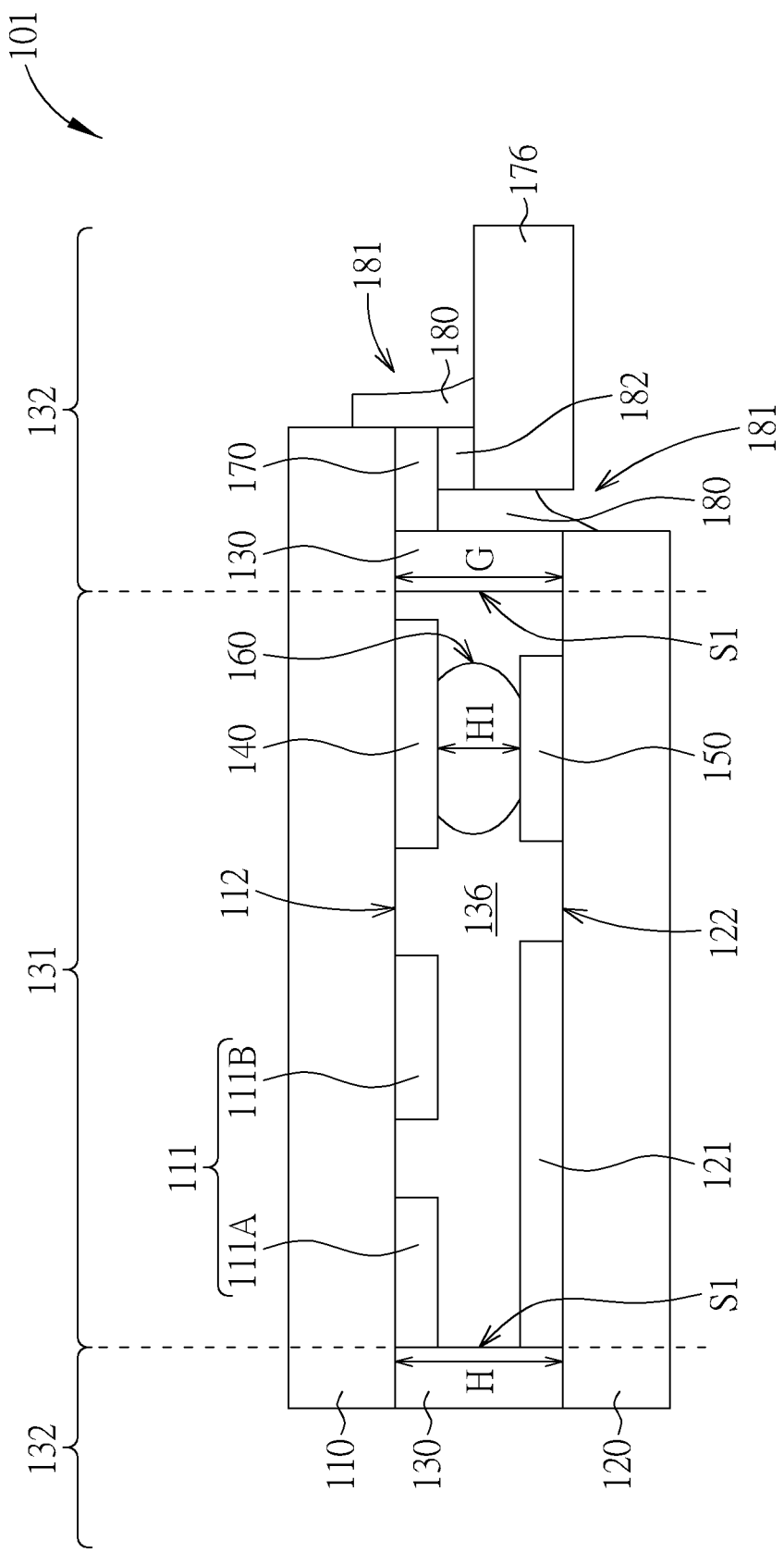
FIG. 1 is a schematic diagram of a cross-sectional structure of a high-frequency device according to an embodiment of the present disclosure, and the structure of some element is shown in a cross-sectional view.

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not in function. In the following description and in the claims, the terms "include", "comprise" and "have" are used in an open-ended fashion, and thus should be interpreted to mean "include, but not limited to . . . ".

It will be understood that when an element or layer is referred to as being "on another component or on another layer" or "connected to another component or to another layer", it can be directly on or directly connected to the other element or layer, or intervening elements or layers may be presented. In contrast, when an element is referred to as being "directly on" or "directly connected to" another element or layer, there are no intervening elements or layers presented. In some embodiments of the present disclosure, terms such as "connection", "interconnection", etc. regarding bonding and connection, unless specifically defined, may refer to two structures which are in direct contact with each other, or are not in direct contact with each other. It is possible that there are other structures located between these two structures. Moreover, terms such as "connection", "interconnection" may also include the case where both structures are movable or both structures are fixed. In addition, the term "coupled" includes any direct and indirect electrical connection means.

The terms "about", "substantially", "equal", or "same" generally mean within 20% of a given value or range, or mean within 10%, 5%, 3%, 2%, 1%, or 0.5% of a given value or range. It is possible that the meanings of the terms "about", "substantially", "equal", or "same" may be implied in the absence of explicit indications. The term. "in a range between A and B" refers to a scope in which A value, other values between A and B, and B value are inclusive.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

In this disclosure, the thickness, length, and width can be measured by using an optical microscope, and the thickness can be measured by a cross-sectional image in an electron microscope, but it is not limited to this. In addition, there may be a certain error in any two values or directions used for comparison. If the first value is equal to the second value, it implies that there may be an error of about 10% between the first value and the second value; if the first direction is perpendicular to the second direction, the angle difference between the first direction and the second direction can be between 80 degrees and 100 degrees; if the first direction is parallel to the second direction, the angle between the first direction and the second direction can be between 0 degrees and 10 degrees Unless otherwise defined, all terms used here (including technical and scientific terms) have the same meanings commonly understood by the general artisans to whom the disclosures belong here. It is understandable that these terms, such as those defined in commonly used dictionaries, should be interpreted as having a meaning consistent with the relevant technology and the background or context of this disclosure, rather than in an idealized or overly formal way of interpretation, unless otherwise specifically defined here.

It should be noted that the technical features in different embodiments described in the following can be replaced, recombined, or mixed with one another to constitute another embodiment without departing from the spirit of the present disclosure.

FIG. 1 is a schematic diagram of a cross-sectional structure of a high-frequency device 101 according to an embodiment of the present disclosure, and the structure of each element is shown in a cross-sectional view. The high-frequency device 101 may include a first substrate 110, a first electrode 111, a second substrate 120, a second electrode 121, a sealant 130 and a dielectric layer 136. In some embodiments, the high-frequency device 101 may optionally include a first connection pad 140, a second connection pad 150 and/or a conductive element 160. In some embodiments, the high-frequency device may include a thin film transistor (not shown) for controlling the driving of the high-frequency device. In some embodiments, the high-frequency signals which are emitted by the high-frequency device may include the electromagnetic wave signals above 1 GHz, but it is not limited thereto. In some embodiments, the high-frequency device may be applied to a (transparent) antenna or to other high-frequency devices on windows or outdoors, but it is not limited thereto.

As shown in FIG. 1, the second substrate 120 is disposed opposite to the first substrate 110. The materials of the first substrate 110 and/or the second substrate 120 may include a transparent or opaque organic material and/or inorganic material. The materials of the first substrate 110 and/or the second substrate 120 may include a rigid material or a flexible soft material. The organic material may include, polyimide (PI), polycarbonate (PC), polyethylene terephthalate (PET), liquid crystal polymer (LCP), other known suitable materials or a combination of the above, but it is not limited thereto. The inorganic material may include glass, quartz, sapphire or ceramic, but it is not limited thereto. In some embodiments, the materials of the first substrate 110 and/or the second substrate 120 may include glass, and glass may have a smooth surface or a surface of lower surface roughness to facilitate the decrease of decay of the high-frequency signals. The term "flexible material" here refers to a material which may be curved, bent, folded, rolled, flexible, stretched and/or other similar deformations to represent at least one of the above-mentioned possible deformations. The materials of the first substrate 110 and/or the second substrate 120 may include a material of low dissipation factor (Df) or low loss tangent (tan δ loss), the Df value may be less than 0.1 or 0.15, but it is not limited thereto. The Df value of glass may be in a range between 0.03 and 0.06 ($0.03 \leq Df$ value$\leq 0.06$), but it is not limited thereto, to be beneficial to the low-loss applications of high-frequency signal antennas.

As shown in FIG. 1, in some embodiments, the gap G between the first substrate 110 and the second substrate 120 may be in a range between 3 µm and 500 µm (3 µm$\leq$gap G$\leq$500 µm), but it is not limited thereto. In some embodiments, the gap G may be in a range between 100 µm and 500 µm (100 µm$\leq$gap G$\leq$500 µm). In some embodiments, the gap G may be in a range between 150 µm and 400 µm (150 µm$\leq$gap G$\leq$400 µm).

As shown in FIG. 1, the first electrode 111 or the second electrode 121 may be disposed on the first substrate 110 or on the second substrate 120, respectively. For example, the first electrode 111 may be disposed on a side 112 of the first substrate 110 adjacent to the second substrate 120, that is, the first electrode 111 is located on the inner side of the first substrate 110 adjacent to the second substrate 120. The second electrode 121 may be disposed on the side 122 of the second substrate 120 adjacent to the first substrate 110, that is, the second electrode 121 is located on the inner side of the second substrate 120 adjacent to the first substrate 110. The first electrode 111 may include a plurality of sub-electrodes, such as a sub-electrode 111A and a sub-electrode 111B, but it is not limited thereto. In other embodiments (not shown), the second electrode 121 may include a plurality of sub-electrodes, and the sub-electrodes of the second electrode 121 may not align with or alternately be arranged with the sub-electrodes of the first electrode 111, but it is not limited thereto.

In some embodiments, one of the first electrode 111 is one of a ground electrode and a patch electrode, the second electrode 121 is another of the ground electrode and the patch electrode. The first electrode 111 and/or the second electrode 121 may include a single layer or a composite (metal) layer. In some embodiments, the first electrode 111 and/or the second electrode 121 may include a metal material, a transparent conductive material, or a combination thereof. The metal material includes copper, nickel, gold, silver, other suitable materials, or a combination of the above, but it are not limited thereto. The transparent conductive materials include transparent conductive materials such as indium tin oxide (ITO) and indium zinc oxide (IZO), but are not limited thereto.

In some embodiments, the manufacturing method of the first electrode 111 or the second electrode 121 may be described as follows, but the present disclosure is not limited thereto. First, a seed layer may be selectively formed on the first substrate 110 or on the second substrate 120. Afterwards, the first electrode 111 or the second electrode 121 is formed on the seed layer, but it is not limited thereto. The first electrode 111 or the second electrode 121 may be formed by electroplating, sputtering or other suitable processes, but it is not limited thereto.

In some embodiments, the sealant 130 may be disposed between the first substrate 110 and the second substrate 120, and the dielectric layer 136 may be sandwiched between the first substrate 110 and the second substrate 120 by the sealant 130. The first electrode 111 and the second electrode 121, the dielectric layer 136 may be sealed in the space defined by the sealant 130. The thickness H of the sealant 130 may be approximately equal to the gap G between the first substrate 110 and the second substrate 120, but it is not limited thereto. The sealant 130 may include transparent material, opaque organic material or inorganic material, such as polymer materials including polyethylene oxide, and other suitable materials, but it is not limited thereto. In some embodiments, the sealant 130 may have a function of water-proof or oxygen-proof property, but it is not limited thereto. The sealant 130 may reduce the possibility of the first electrode 111 and/or the second electrode 121 being corroded. For example, the high-frequency device 101 may have an operational region 131 and a non-operational region 132, and the inner edges of the sealant 130 may define the high-frequency device 101 to have an operational region 131 and a non-operational region 132. The operational region 131 may be defined by a region enclosed by the inner edge S1 of the sealant 130 and the first substrate 110 and the second substrate 120. The non-operational region 132 is defined by a region outside of the operational region 131.

In some embodiments, the dielectric layer 136 may be located in the operational region 131. The dielectric layer 136 may have a material of a low Df value, such as a material of a Df value less than or equal to 0.01 or 0.03, but it is not limited thereto. Materials with a low Df value are beneficial to reduce the loss of electromagnetic waves after passing through the dielectric layer 136, and may improve the reliability of the high-frequency device. For example, the dielectric layer 136 may include a gas (such as helium, carbon dioxide or other gases) or vacuum. The Df value of vacuum or s gas is about 0, which is beneficial to improve the reliability of the high-frequency device.

In some embodiments, the first connection pad 140 and the second connection pad 150 may be respectively disposed on the surfaces of the first substrate 110 and the second substrate 120, but are not limited thereto. In some embodiments, the first connection pad 140 may be disposed on the side surface 112 of the first substrate 110 adjacent to the second substrate 120. In some embodiments, the second connection pad 150 may be disposed on the side surface 122 of the second substrate 120 adjacent to the first substrate 110. In some embodiments, the first connection pad 140 may be one of a ground connection pad and a patch connection pad, and the second connection pad 150 may be another of the ground connection pad and the patch connection pad. The second connection pad 150 may be electrically connected to the second electrode 121. In some embodiments, the conductive element 160 may be disposed between the first connection pad 140 and the second connection pad 150, and the first connection pad 140 is electrically connected to the second connection pad 150 via the conductive element 160, but it is not limited thereto. In some embodiments, the conductive element is disposed in the operational region. In some embodiments, the first connection pad 140 and the first electrode 111 may be the same conductive layer or different conductive layers, and the second connection pad 150 and the second electrode 121 may be the same conductive layer or different conductive layers. In this embodiment, the first connection pad 140 is electrically insulated from the first electrode 111, and the first electrode 111 is electrically connected to the bonding pad 170 via other circuits (not shown). The descriptions of the bonding pad 170 are given later.

In some embodiments, at least one of the first connection pad 140 and the second connection pad 150 may include a copper layer, a nickel layer and a gold layer, but it is not limited thereto. In some embodiments, at least one of the first connection pad 140 and the second connection pad 150 may include at least one of a copper layer, a nickel layer, a gold layer or a silver layer, but it is not limited thereto. In some embodiments, the first connection pad 140 or the second connection pad 150 may include a composite metal layer. The stacking layers or materials of the first connection pad 140 and the second connection pad 150 may be the same or different.

In some embodiments, the conductive element 160 may contact with the first connection pad 140 and/or contact with the second connection pad 150, the first connection pad 140 may be electrically connected to the second connection pad 150 via the conductive element 160, but it is not limited thereto. In some embodiments, the conductive element 160 is electrically connected to the first connection pad 160 and the second connection pad 150 via a tin layer. In some embodiments, the conductive element 160 may be not in contact with the sealant 130. The thickness H1 (or diameter) of the conductive element 160 may be less than or equal to the gap G or the thickness H, but it is not limited thereto. In some embodiments, the thickness H1 of the conductive element 160 may be in a range between 3 μm and 500 μm (3 μm≤thickness H1≤500 μm), but it is not limited thereto. In some embodiments, the thickness H1 of the conductive element 160 may be in a range between 100 μm and 450 μm (100 μm≤thickness H1≤450 μm). In some embodiments, the thickness H1 of the conductive element 160 may be in a range between 150 μm and 400 μm (150 μm≤thickness H1≤400 μm). The conductive element 160 shown in FIG. 1 may be roughly spherical or arc-shaped, but it is not limited thereto. In other embodiments (not shown), the conductive element 160 may be roughly columnar, trapezoidal, rectangular or other shapes. The materials of the conductive element 160 includes a metal, such as gold, copper, tin, silver, other suitable materials or a combination thereof, but it is not limited thereto.

In some embodiments (not shown), the conductive particles (such as gold or other materials) or other conductive materials may be selectively mixed in the sealant 130. The first connection pad 140 and the second connection pad 150 may contact with a part of the sealant 130. The first connection pad 140 and the second connection pad 150 may be electrically connected via the conductive particles in the sealant 130, but it is not limited thereto. In some embodiments shown in FIG. 1, the conductive particles (such as gold or other materials) or other conductive materials are not present in the sealant 130.

In some embodiments, the high-frequency device 101 may include at least one bonding pad 170. The bonding pad 170 is disposed in the non-operational region 132 and is electrically connected to at least one of the first electrode 111 and the second electrode 121. In some embodiments, the bonding pad 170 may be located on the side 112 of the first substrate 110, but it is not limited thereto. In other embodiments (not shown), the bonding pad 170 may be located on the side 122 of the second substrate 120. In some embodiments, the bonding pad 170 is disposed in an outer lead bonding (OLB). In some embodiments, the bonding pad 170 may be electrically connected to the first connection pad 140 and/or to the second connection pad 150, and the bonding pad 170 may be electrically connected to the first connection pad 140 via other circuits (not shown). In some embodiments, the external electronic component 176 may have a bonding pad 182, and the bonding pad 182 may be electrically connected to the bonding pad 170 to control or drive the electronic components of the high-frequency device 101 by the external electronic component 176. In some embodiments, the external electronic component 176 may control at least one of the first electrode 111 and/or the second electrode 121 via the bonding pad 182 and the bonding pad 170. The external electronic component 176 may include an integrated circuit (IC), a circuit board, or other electronic components, but it is not limited thereto. The circuit board may include a flexible printed circuit (FPC) or a rigid circuit board, but it is not limited thereto. As shown in the embodiment of FIG. 1, the second connection pad 150 is electrically connected to the second electrode 121, the bonding pad 170 is electrically connected to the second electrode 121 via the second connection pad 150 and the first connection pad 140. The first connection pad 140 is electrically insulated from the first electrode 111, and the first electrode 111 may be electrically connected to another bonding pad 170 via another circuit (not shown). The bonding pad 170 and another bonding pad 170 are electrically connected to different bonding pads 182 on the external electronic component 176. Via the installation of the first connection pad 140, the second connection pad 150 and the conductive element 160 as described above, and the electrical connection of the bonding pad 170 to the first connection pad 140, the external electronic components 176 which controls or drives the first electrode 111 and/or the second electrode 121 may be integrated. Or the external electronic component which controls or drives the first electrode 111 and/or the second electrode 121 may be provided on the first substrate 110 or on the second substrate 120, to reduce the installation or quantity of external electronic components, or to simplify the process. In some embodiments, the first electrode 111 and the second electrode 121 may be designed to be driven by the same integrated circuit, but it is not limited thereto.

In some embodiments, the high-frequency device 101 may include a protective layer 180, and the protective layer 180 may be disposed in the non-operational region 132. In some embodiments, the protective layer 180 includes waterproof glue (for example, tuffy). The protective layer 180 may selectively contact (or cover) various elements located in the non-operational region 132. In some embodiments, the protective layer 180 may be in contact with (or cover) at least one or more of the bonding pad 170, the first substrate 110, the second substrate 120, the sealant 130, the bonding pad 182 and the external electronic component 176, but it is not limited thereto. In some embodiments, the protective layer 180 may fill the void 181 of the non-operational region 132, but it is not limited thereto. The void 181 is a void formed between the panel (that is, including the first substrate 110 and the second substrate 120) and the external electronic component 176, but it is not limited thereto. The protective layer 180 may be used to protect various components which are located in the non-operational region 132 or to reduce the penetration of moisture into various components which are located in the non-operational region 132.

The high-frequency device disclosed in the present disclosure is not limited to the foregoing embodiment. Other embodiments of the present disclosure will be disclosed below. In order to simplify the descriptions and highlight the differences between the embodiments, the same reference numerals are used to label the same elements in the following, and the similar contents are not elaborated again. In addition, please refer to the foregoing embodiments for the conditions of the components and of process steps in the subsequent embodiments, so the details are not elaborated again.

Figure 2:
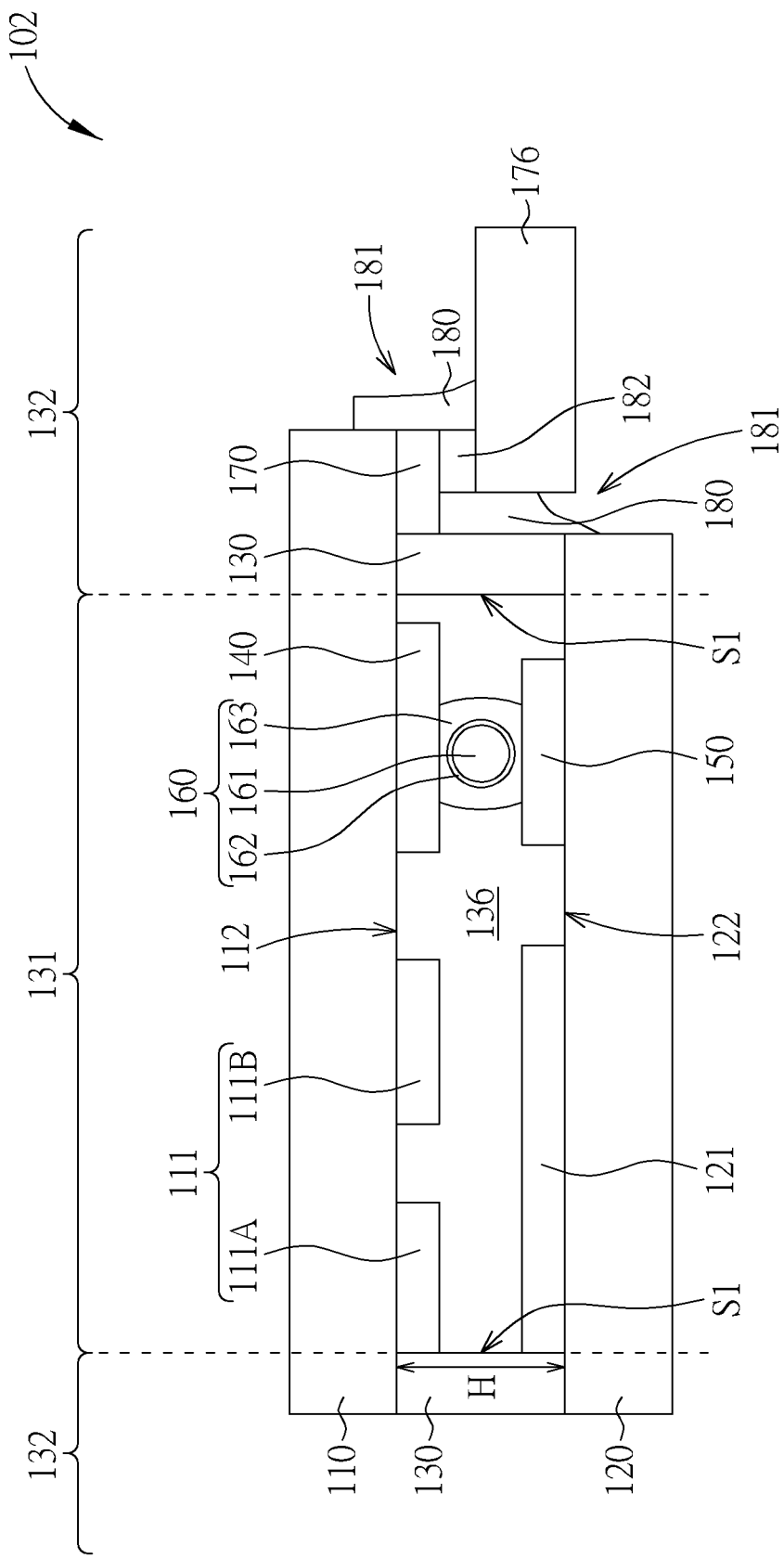
FIG. 2 is another schematic diagram of a cross-sectional structure of a high-frequency device according to an embodiment of the present disclosure, and the structure of each element is shown in a cross-sectional view.

FIG. 2 is another schematic diagram of a cross-sectional structure of a high-frequency device 102 according to an embodiment of the present disclosure, and the structure of each element is shown in a cross-sectional view. Compared with the embodiment in FIG. 1, the main difference resides in the composition of the conductive element 160. As shown in FIG. 2, the conductive element 160 may be a composite structure. For example, the conductive element 160 may include an elastomer 161, a conductive layer 162 and a conductive material 163, but it is not limited thereto. The elastomer 161 may include plastic, but it is not limited thereto. The gap G between the first substrate 110 and the second substrate 120 is controlled by the elastomer 161. In some embodiments, the conductive layer 162 may include a metal, such as gold, silver or other alloys, but it is not limited thereto. The conductive layer 162 may cover the elastomer 161, and the conductive material 163 may cover the conductive layer 161. In some embodiments, the conductive material 163 may include a metal, such as tin. In some embodiments, the conductive material 163 may be electrically connected to the first connection pad 140 and to the second connection pad 150 by reflow, or let the conductive material 163 in contact with the first connection pad 140 and with the second connection pad 150, but it is not limited thereto. In addition to being electrically connected to the first connection pad 140 and to the second connection pad 150, the conductive element 160 may serve as an elastic support for the first substrate 110 and the second substrate 120. In some embodiments, the conductive material 163 may be coated on the outer side of the conductive layer 162, and the outline of the conductive material 163 may be approximately along the outer shape of the elastomer 161 or the outer shape of the conductive layer 162, and the conductive material 163 has an arc-shaped edge. For example, the profile of the conductive material 163 has a bulging shape, similar to a lantern shape, but it is not limited thereto.

Figure 3:
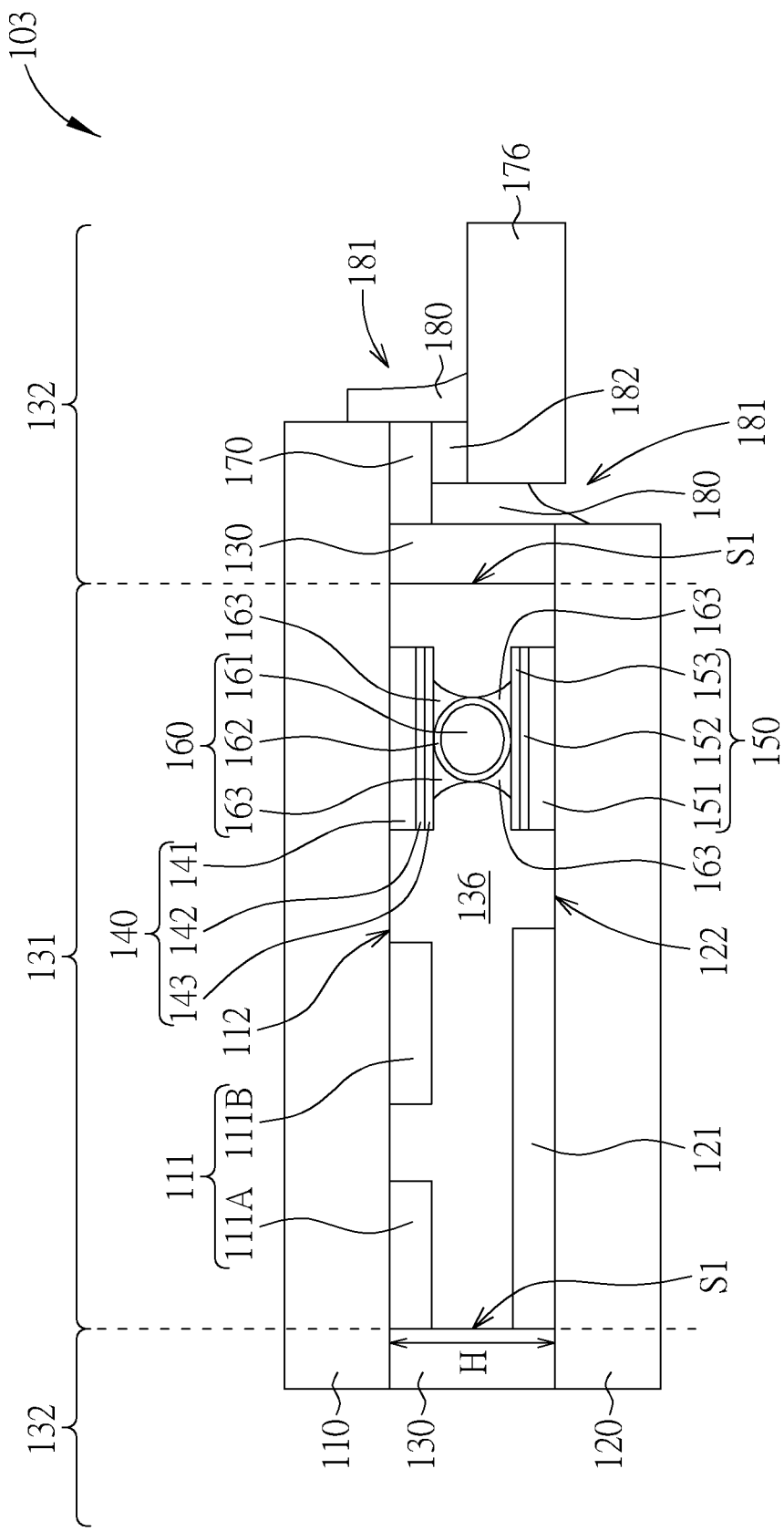
FIG. 3 is another schematic diagram of a cross-sectional structure of a high-frequency device according to an embodiment of the present disclosure, and the structure of each element is shown in a cross-sectional view.

FIG. 3 is another schematic diagram of a cross-sectional structure of a high-frequency device 103 according to an embodiment of the present disclosure, and the structure of each element is shown in a cross-sectional view. Compared with the embodiment in FIG. 1, the main difference resides in the different shape of the conductive element 160. In addition, the first connection pad 140 and/or the second connection pad 150 may include a composite layer, such as a composite metal layer. In FIG. 3, the outline of the conductive element 160 has a concave shape in the middle, similar to an hourglass shape, but it is not limited thereto. The first connection pad 140 and/or the second connection pad 150 in FIG. 3 may include a composite layer, and the composite layer may include three sub-layers or optional quantity of sub-layers. For example, the first connection pad 140 in FIG. 3 includes a sub-layer 141, a sub-layer 142 and/or a sub-layer 143, and the second connection pad 150 includes a sub-layer 151, a sub-layer 152 and/or a sub-layer 153, but it is not limited thereto. In some embodiments, the number of sub-layers included in the first connection pad 140 and in the second connection pad 150 may be the same or different. For example, in some embodiments, the material of the bottom layer (for example, sub-layer 141) of the first connection pad 140 or the bottom layer (for example, sub-layer 151) of the second connection pad 150 includes copper. When tin is used as the solder material for the first connection pad 140 and/or the second connection pad 150 (i.e., the conductive material 163 is tin), an intermetallic compound (IMC) formed by copper and tin is prone to be brittle because the intermetallic compound is easily formed between copper and tin. When the intermetallic compound cracks, the electric conduction between the first connection pad 140 and the second connection pad 150 may be jeopardized. The first connection pad 140 and/or the second connection pad 150 in this embodiment may be provided with an intermediate layer (i.e. the sub-layer 142 or the sub-layer 152), and the material of the intermediate layer (i.e. the sub-layer 142 or the sub-layer 152) may include nickel or other suitable materials, thereby reducing the interfacial metal eutectic compounds between copper and tin and reducing the above problems, but it is not limited thereto. In some embodiments, the intermediate layer (i.e. the sub-layer 142 or the sub-layer 152) may be formed by electroless plating or other methods, but the present disclosure is not limited thereto. In some embodiments, the first connection pad 140 and/or the second connection pad 150 may optionally have a top layer (i.e., the sub-layer 143 or the sub-layer 153). The material of the top layer (i.e., the sub-layer 143 or the sub-layer 153) may be a gold layer or other conductive material layer which is less prone to corrosion, but it is not limited thereto. The top layer (i.e., the sub-layer 143 or the sub-layer 153) reduces the possibility of corrosion or oxidation of the first connection pad 140 and/or of the second connection pad 150. The top layer (i.e., the sub-layer 143 or the sub-layer 153) may be formed by electroless plating or other methods, but it is not limited thereto. The present disclosure may improve the electrical connection yield, or reduce the possibility of corrosion to improve the reliability of the high-frequency devices of the first connection pad 140 and/or the second connection pad 150 with the design of the above-mentioned intermediate layer (i.e. the sub-layer 142 or the sub-layer 152) or of the top layer (i.e., the sub-layer 143 or the sub-layer 153). The first connection pad 140 and the second connection pad 150 with a composite structure in this embodiment may be optionally applied to other embodiments.

In some embodiments, the first electrode 111, the first connection pad 140 and/or the bonding pad 170 may be formed of the same conductive layer, that is, the first electrode 111, the first connection pad 140 and/or the bonding pad 170 may be formed of the same process, but it is not limited thereto. When the first electrode 111, the first connection pad 140 and/or the bonding pad 170 are formed by the same manufacturing process, the number of the sub-layers of the first electrode 111 is the same as the number of the first connection pad 140 and/or the bonding pad 170, but it is not limited thereto. In some embodiments, the second electrode 121 and the second connection pad 150 may be formed by the same conductive layer, that is, the second electrode 121 and the second connection pad 150 may be formed by the same manufacturing process, but it is not limited thereto. When the second electrode 121 and the second connection pad 150 are formed by the same manufacturing process, the number of sub-layers of the second electrode 121 is the same as the number of the second connection pad 150, but it is not limited thereto.

Figure 4:
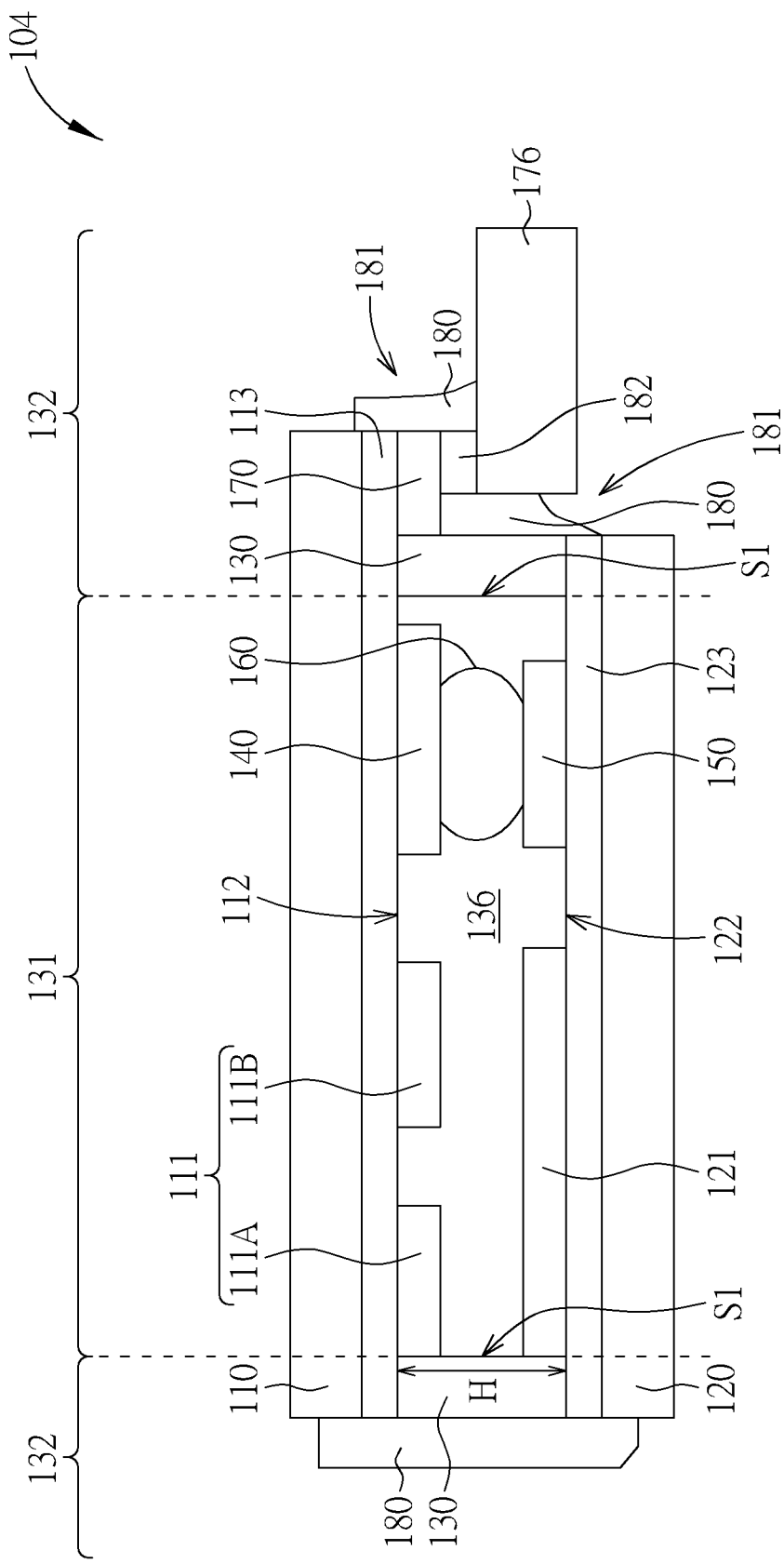
FIG. 4 is another schematic diagram of a cross-sectional structure of a high-frequency device according to an embodiment of the present disclosure, and the structure of each element is shown in a cross-sectional view.

FIG. 4 is another schematic diagram of a cross-sectional structure of a high-frequency device 104 according to an embodiment of the present disclosure, and the structure of each element is shown in a cross-sectional view. Compared with the embodiment in FIG. 1, the main difference resides in the the high-frequency device 104 which includes a redistribution layer (RDL) 113 and/or a redistribution layer 123.

As shown in FIG. 4, the redistribution layer 113 may be located between the first substrate 110 and the first electrode 111, and the redistribution layer 123 may be located between the second substrate 120 and the second electrode 121. In some embodiments, the first electrode, the first connection pad 140 and/or the bonding pad 170 may be electrically connected via the redistribution layer 113, but it is not limited thereto. In some embodiments, the second electrode 121 and the second connection pad 150 may be electrically connected via the redistribution layer 123. The redistribution layer 113 and/or the redistribution layer 123 may have a conductive structure composed of at least one conductive layer and at least one dielectric layer. In some embodiments, the sealant 130 may be selectively disposed on the redistribution layer 113 and/or on the redistribution layer 123, but it is not limited thereto. In some embodiments, the sealant 130 may be selectively disposed between the redistribution layer 113 and the redistribution layer 123. In some embodiments (not shown), the sealant 130 may contact the first substrate 110 and/or the second substrate 120, but it is not limited thereto. In some embodiments, the protective layer 180 may contact or cover the edges of the redistributed layer 113 and/or the redistributed layer 123 to reduce the influence of water and oxygen on the redistributed layer 113 and/or on the redistributed layer 123, but it is not limited thereto.

Figure 5:
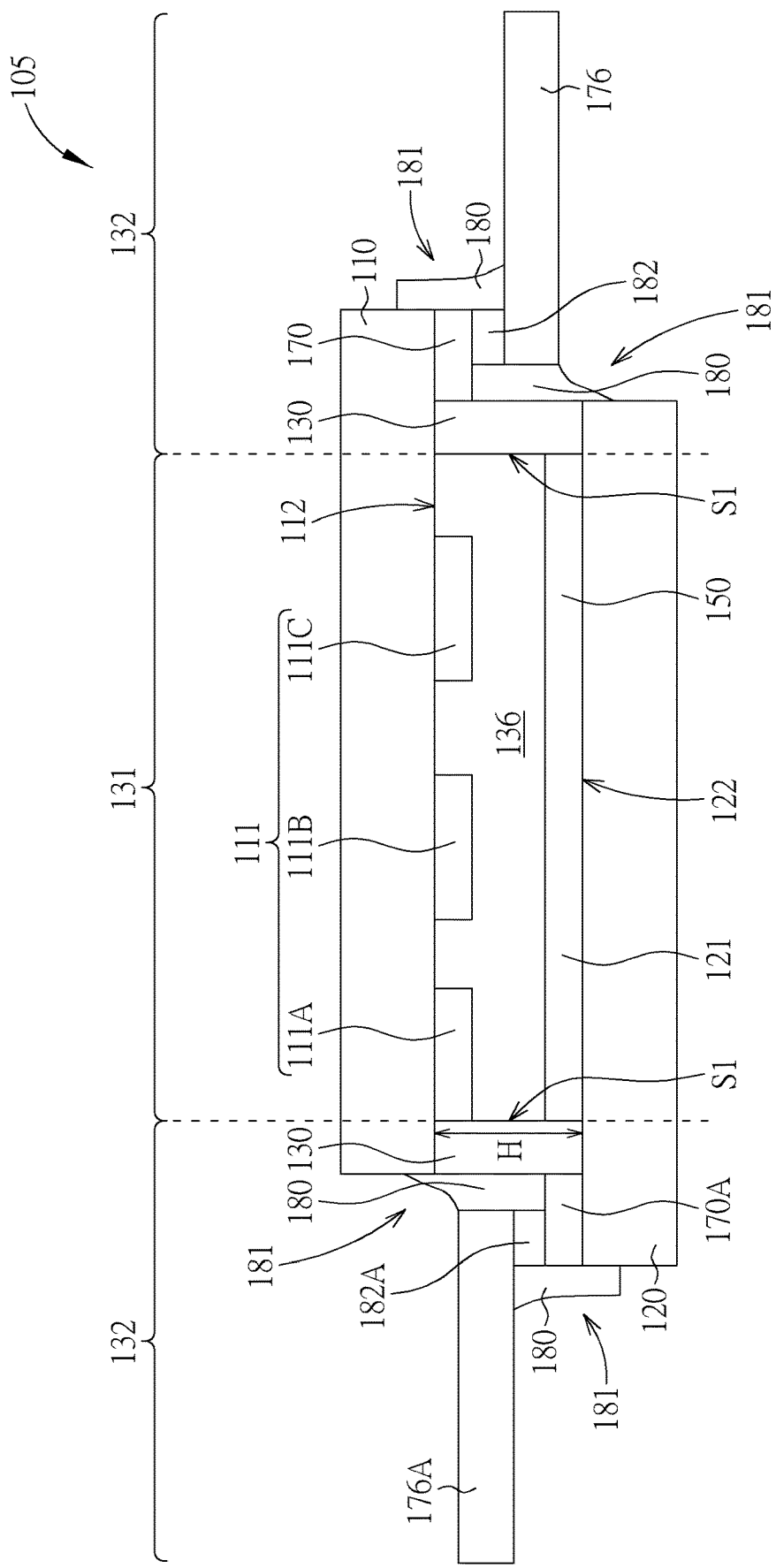
FIG. 5 is another schematic diagram of a cross-sectional structure of a high-frequency device according to an embodiment of the present disclosure, and the structure of each element is shown in a cross-sectional view.

FIG. 5 is another schematic diagram of a cross-sectional structure of a high-frequency device 105 according to an embodiment of the present disclosure, and the structure of each element is shown in a cross-sectional view. Compared with the embodiment in FIG. 1, the main difference resides in the high-frequency device 105 which may omit the conductive element, the first connection pad and the second connection pad, and in the introduction of an additional bonding pad 170A. As shown in FIG. 5, the bonding pad 170 and/or the bonding pad 170A is disposed in the non-operational region 132, and the bonding pad 170 and/or the bonding pad 170A and at least one of the first electrode 111 and the second electrode 121 are electrically connection. For example, the first electrode 111 of the high-frequency device 105 may include a sub-electrode 111A, a first sub-electrode 111B and a sub-electrode 111C. The first electrode 111 and the bonding pad 170 are disposed on the first substrate 110, and the first electrode 111 is electrically connected to the bonding pad 170, and the first electrode 111 may be electrically connected to the external electronic component 176 via the bonding pad 170. On the other hand, the second electrode 121 and the bonding pad 170A are disposed on the second substrate 120, the second electrode 121 is electrically connected to the bonding pad 170A, and the second electrode 121 may be electrically connected to the external electronic component 176A via the bonding pad 170A. The external electronic component 176A is similar to the external electronic component 176, so the details are not elaborated again. In some embodiments (not shown), the bonding pad 170 and the bonding pad 170A may be located on the same substrate. In the embodiment of FIG. 5, the design of omitting the aforementioned conductive element, the first connection pad and the second connection pad may be beneficial to simplify the manufacturing process or to reduce the cost.

Figure 6:
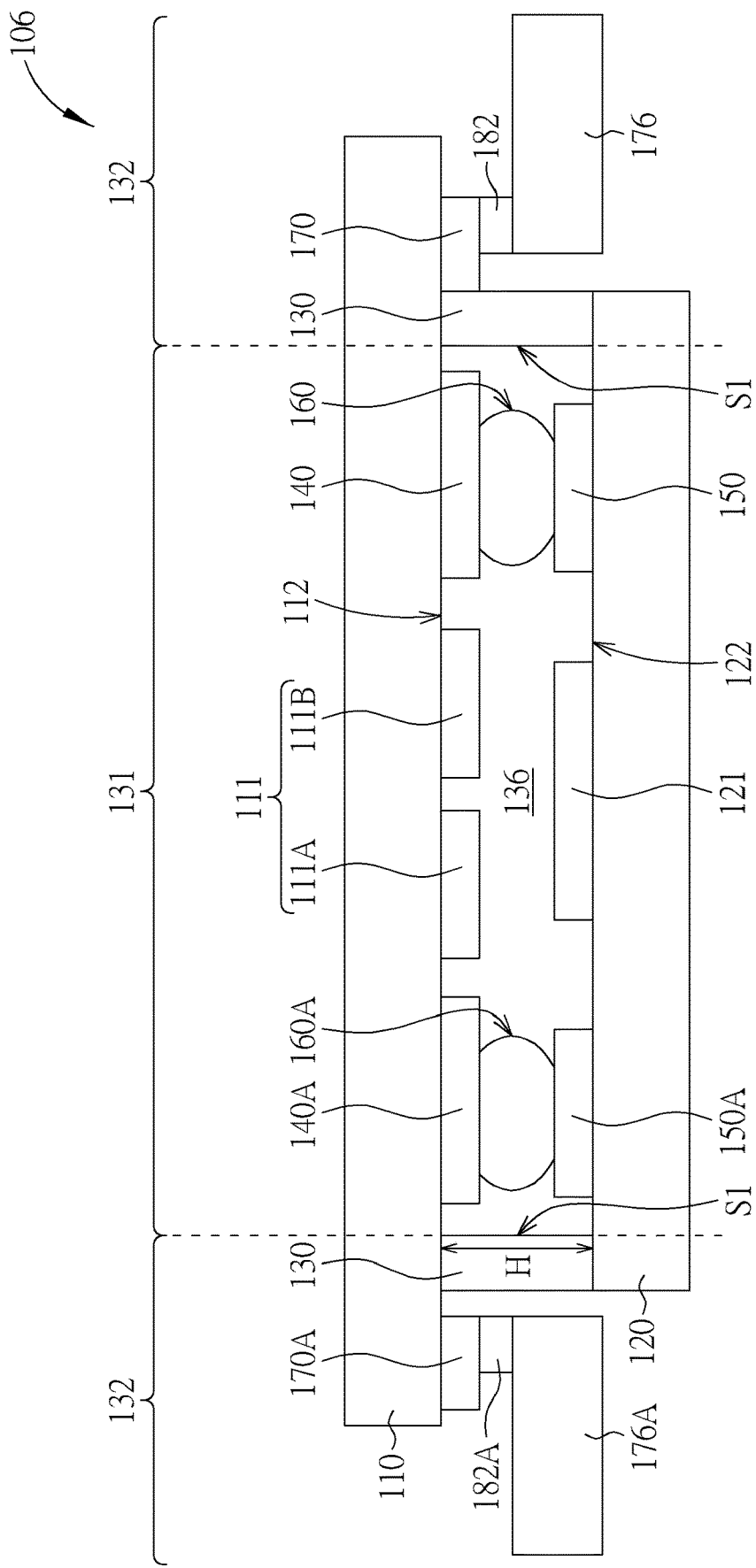
FIG. 6 is another schematic diagram of a cross-sectional structure of a high-frequency device according to an embodiment of the present disclosure, and the structure of each element is shown in a cross-sectional view.

FIG. 6 is another schematic diagram of a cross-sectional structure of a high-frequency device 106 according to an embodiment of the present disclosure, and the structure of each element is shown in a cross-sectional view. Compared with the embodiment in FIG. 1, the main difference resides in the high-frequency device 106 which additionally has a first connection pad 140A, a second connection pad 150A, a conductive element 160A and/or a bonding pad 170A. As shown in FIG. 6, the first connection pad 140A may be disposed on the side 112 of the first substrate 110, and the first electrode 110 is located between the first connection pad 140A and the first connection pad 140, or the first connection pad 140A and the first connection pad 140 are disposed in different locations of the side 112 of the first substrate 110, but the present disclosure is not limited thereto. The second connection pad 150A may be disposed on the side 122 of the second substrate 120, and the second electrode 121 is located between the second connection pad 150A and the second connection pad 150, or the second connection pad 150A and the second connection pad 150 is disposed in different locations of the side 122 of the second substrate 120, but the present disclosure is not limited thereto. In some embodiments, the second connection pad 150A and the second connection pad 150 may be electrically connected to the second electrode 121. In some embodiments, the conductive element 160A may be disposed in the operational region 131, the conductive element 160A may be located between the first connection pad 140A and the second connection pad 150A, and the first connection pad 140A is electrically connected to the second connection pad 150A via the conductive element 160A. The thickness or material of the conductive element 160A may be similar to that of the conductive element 160 so the details are not elaborated again.

On the other hand, the bonding pad 170A and the bonding pad 170 may be located on the side 112 of the first substrate 110. The first connection pad 140A, the second connection pad 150A and the conductive element 160A may be electrically connected to the bonding pad 170A, and are electrically connected to the external electronic component 176A via the bonding pad 170A so that the external electronic component 176A may be used to drive or control the second electrodes 121. In this example, different external electronic components (such as the external electronic component 176A and the external electronic component 176) may transmit signals to the second electrode 121 via bonding pads (such as the bonding pad 170A and the bonding pad 170) located in different regions, to disperse or to more uniformly transmit signals to the second electrode 121. In other embodiments, the high-frequency device may optionally have more first connection pads, second connection pads, conductive elements and/or bonding pads.

Figure 7:
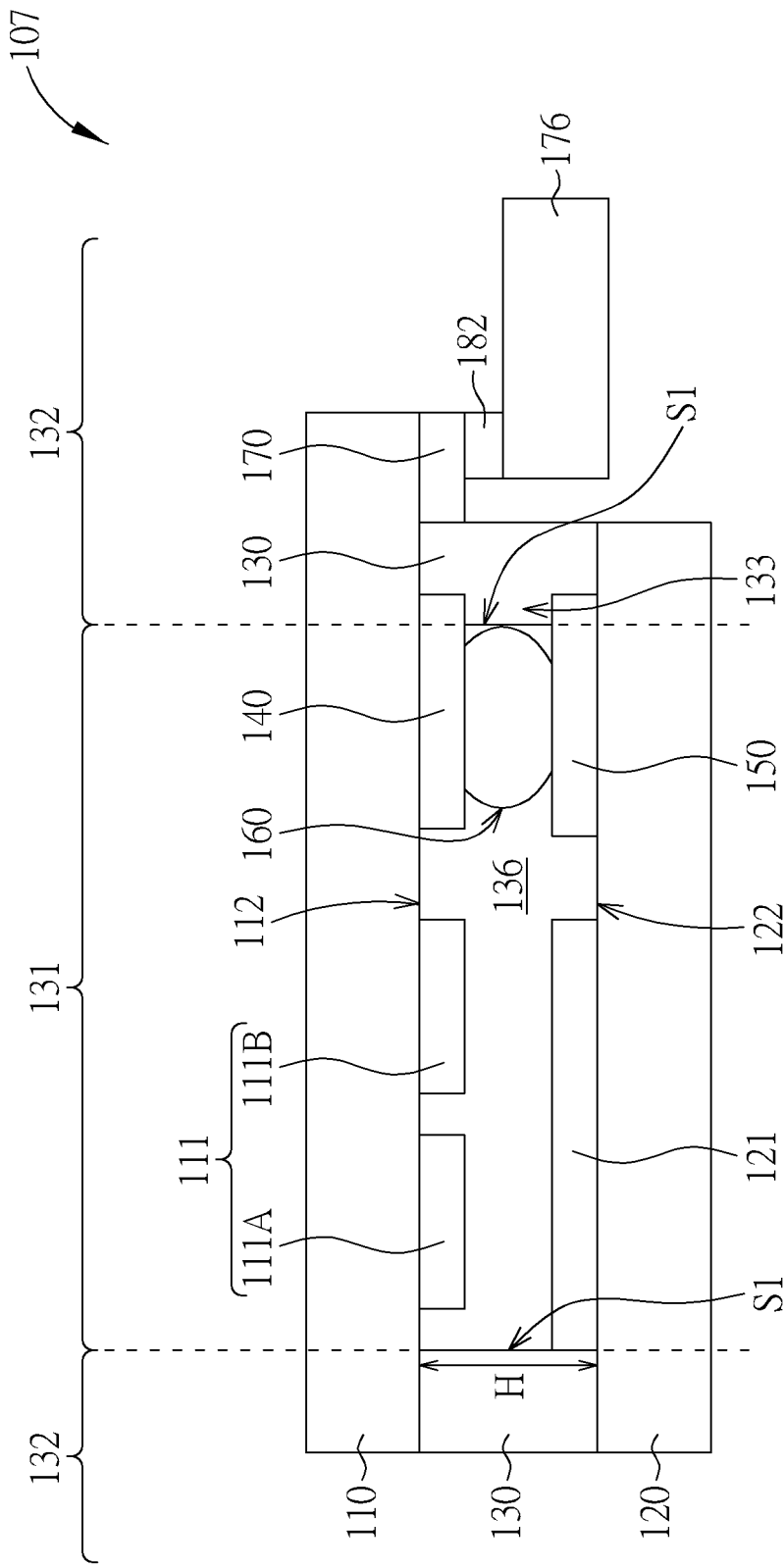
FIG. 7 is another schematic diagram of a cross-sectional structure of a high-frequency device according to an embodiment of the present disclosure, and the structure of each element is shown in a cross-sectional view.

FIG. 7 is another schematic diagram of a cross-sectional structure of a high-frequency device 107 according to an embodiment of the present disclosure, and the structure of each element is shown in a cross-sectional view. Compared with the embodiment of FIG. 1, the main difference resides in a part of the sealant 130 able to contact at least one of the first connection pad 140 and the second connection pad 150. In some embodiments, the sealant 130 may include a bulge 133. As shown in FIG. 7, the sealant 130 on the right includes a bulge 133 and the bulge 133 may contact at least one of the first connection pad 140 and the second connection pad 150, or cover a partial surface of the first connection pad 140 and/or of the second connection pad 150. In some embodiments, the sealant 130 (such as the bulge 133) may further contact a part of the conductive element 160.

Figure 8:
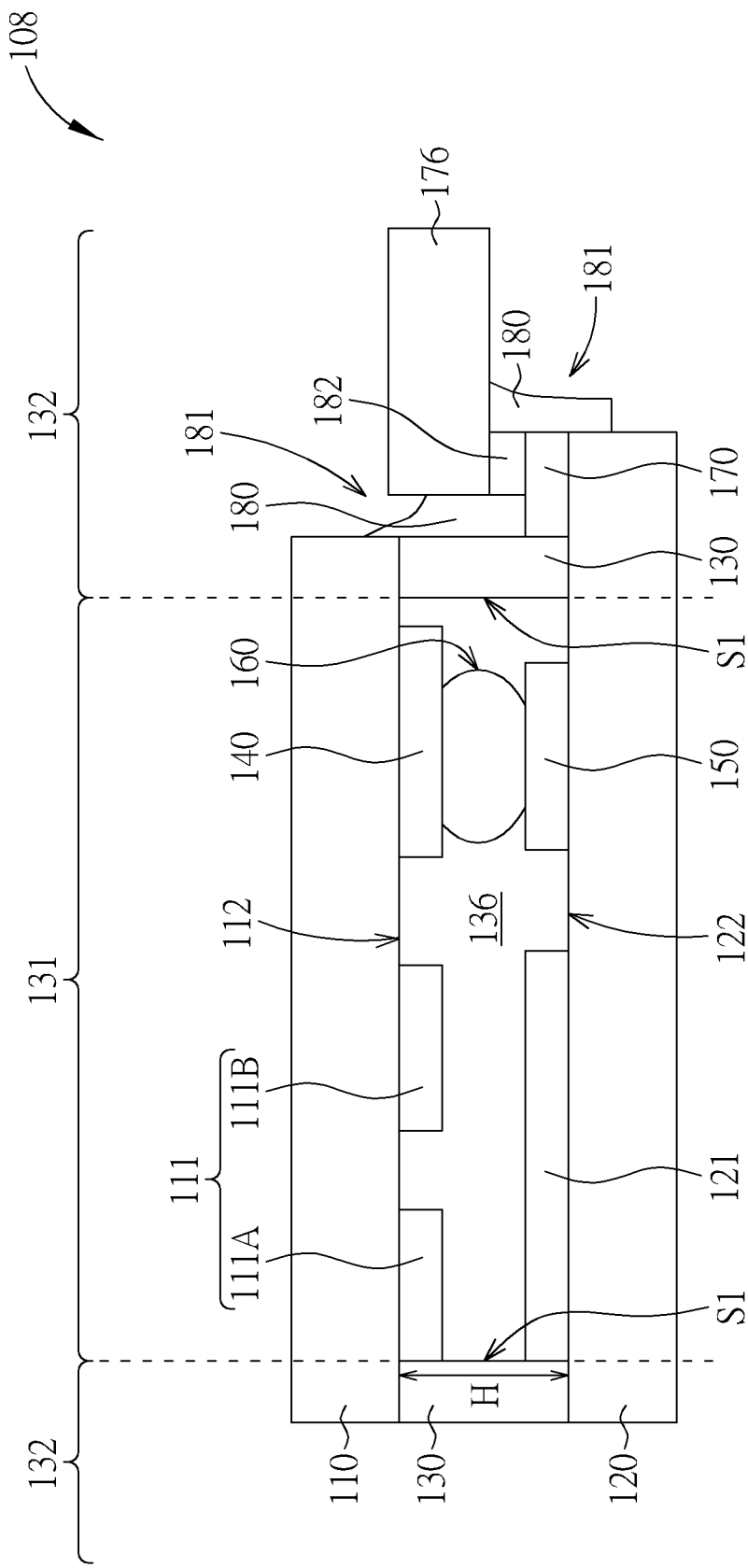
FIG. 8 is another schematic diagram of a cross-sectional structure of a high-frequency device according to an embodiment of the present disclosure, and the structure of each element is shown in a cross-sectional view.

FIG. 8 is another schematic diagram of a cross-sectional structure of a high-frequency device 180 according to an embodiment of the present disclosure, and the structure of each element is shown in a cross-sectional view. Compared with the embodiment of FIG. 1, the main difference resides in the bonding pad 170 disposed on the side 122 of the second substrate 120. It should be noted that, in the embodiment shown in FIG. 8, the second connection pad 150 and the first connection pad 140 are electrically connected to the first electrode 111, and the second connection pad 150 is electrically insulated from the second electrode 121. In this embodiment, the external electronic component 176 may be electrically connected to the bonding pad 170 via the bonding pad 182, the bonding pad 170 is electrically connected to the second connection pad 150 and to the first connection pad 140, and the first connection pad 140 is electrically connected to the first electrode 111. Thereby, the external electronic component 176 is electrically connected to the first electrode 111 via the bonding pad 170. In addition, the second electrode 121 may be electrically connected to another bonding pad 170 via another circuit (not shown) so that the second electrode 121 may be electrically connected to the external electronic component 176. With the above design, the external electronic components that drive or control the first electrode 111 and the second electrode 121 may be integrated to reduce to one or to a smaller number, but it is not limited thereto. Or the external electronic components that drive or control the first electrode 111 and the second electrode 121 may be provided on the same substrate to reduce the complexity of the installation of the external electronic components.

In the structure of the high-frequency device of each embodiment of the present disclosure, the first electrode and the second electrode may be respectively provided on two substrates, and the first electrode and the second electrode are sealed between the two substrates by a sealant so that the first electrode and the second electrode are not prone to be affected by the environment such as moist or oxygen. The configuration is beneficial to the demand of using a high-frequency signal antenna of the present disclosure to serve as an outdoor transparent antenna.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A high-frequency device, comprising:
   a first substrate;
   a second substrate disposed opposite to the first substrate;
   a first electrode disposed on a side surface of the first substrate adjacent to the second substrate;
   a second electrode disposed on a side surface of the second substrate adjacent to the first substrate;
   a sealant disposed between the first substrate and the second substrate; and
   a dielectric layer sandwiched between the first substrate and the second substrate by the sealant, wherein the dielectric layer includes a gas or vacuum.

2. The high-frequency device of claim 1, further comprising:
   a first connection pad disposed on the side surface of the first substrate adjacent to the second substrate;
   a second connection pad disposed on the side surface of the second substrate adjacent to the first substrate, and the second connection pad electrically connected to the second electrode; and
   a conductive element disposed between the first connection pad and the second connection pad, and the first connection pad electrically connected to the second connection pad via the conductive element.

3. The high-frequency device of claim 2, having an operational region and a non-operational region, wherein the conductive element is disposed in the operational region.

4. The high-frequency device according to claim 3, further comprising a bonding pad disposed in the non-operational region, wherein the bonding pad is electrically connected to at least one of the first electrode and the second electrode.

5. The high-frequency device according to claim 4, further comprising a protective layer disposed in the non-operational region, wherein the protective layer is in contact with at least one of the bonding pad, the first substrate, the second substrate and the sealant.

6. The high-frequency device according to claim 5, wherein the protective layer fills a void in the non-operational region.

7. The high-frequency device according to claim 2, wherein a thickness of the conductive element is in a range between 3 μm and 500 μm.

8. The high-frequency device according to claim 2, wherein the first connection pad or the second connection pad comprises a composite metal layer.

9. The high-frequency device of claim 2, wherein at least one of the first connection pad and the second connection pad comprises a copper layer, a nickel layer and a gold layer.

10. The high-frequency device according to claim 2, wherein the conductive element comprises an elastomer, a conductive layer and a conductive material, the conductive layer covers the elastomer, and the conductive material covers the conductive layer.

11. The high-frequency device of claim 2, wherein the conductive element is not in contact with the sealant.

12. The high-frequency device according to claim 2, wherein the first connection pad and the second connection pad contact a part of the sealant.

13. The high-frequency device according to claim 2, wherein the sealant contacts a part of the conductive element.

14. The high-frequency device according to claim 1, wherein the first electrode is one of a ground electrode and a patch electrode.

15. The high-frequency device according to claim 14, wherein the second electrode is another one of the ground electrode and the patch electrode.

16. The high-frequency device according to claim 1, further comprising a redistribution layer located between the first substrate and the first electrode.

17. The high-frequency device according to claim 16, further comprising a protective layer, wherein the protective layer contacts an edge of the redistributed layer.

18. The high-frequency device according to claim 1, further comprising a redistribution layer located between the second substrate and the second electrode.

19. The high-frequency device according to claim 1, wherein the high-frequency device is applied to an antenna.

* * * * *